United States Patent
Chang

(10) Patent No.: US 9,742,410 B1
(45) Date of Patent: Aug. 22, 2017

(54) PROGRAMMING SYSTEM AND METHOD

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Yao-Tsung Chang, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/235,400

(22) Filed: Aug. 12, 2016

(30) Foreign Application Priority Data

May 26, 2016 (TW) .............................. 105116537 A

(51) Int. Cl.
  *H03K 19/173* (2006.01)
  *H03K 19/177* (2006.01)
  *G01R 31/3185* (2006.01)

(52) U.S. Cl.
  CPC .................. *H03K 19/17748* (2013.01); *G01R 31/318597* (2013.01); *H03K 19/17744* (2013.01)

(58) Field of Classification Search
  CPC ....... H03K 19/17744; H03K 19/17748; H03K 5/13; H03K 5/135; H03K 5/15; H03K 3/84; G01R 31/318597; G06F 1/04; G06F 1/06; G06F 1/08; G06F 1/10; G06F 1/12; G06F 13/38; G06F 13/382; G06F 13/385; G06F 13/387; G06F 13/40; G06F 13/4004; G06F 13/4027
  See application file for complete search history.

(56) References Cited

U.S. PATENT DOCUMENTS

| 5,510,740 | A  | * | 4/1996 | Farrell | ................... | H03K 5/135 |
| | | | | | | 327/115 |
| 7,266,202 | B1 | | 9/2007 | Kawakami et al. | | |
| 2011/0320853 | A1 | * | 12/2011 | Maruko | .................... | G06F 1/10 |
| | | | | | | 713/500 |
| 2013/0304954 | A1 | * | 11/2013 | Decesaris | ............... | G06F 13/38 |
| | | | | | | 710/110 |
| 2015/0363353 | A1 | * | 12/2015 | Enami | ................. | G06F 13/4282 |
| | | | | | | 710/110 |

FOREIGN PATENT DOCUMENTS

| TW | 594566  | 6/2004 |
| TW | I501141 B | 9/2015 |
| TW | I514280 B | 12/2015 |

* cited by examiner

*Primary Examiner* — Jason M Crawford
(74) *Attorney, Agent, or Firm* — Steven Reiss

(57) ABSTRACT

A programming system includes an upper computer, a calculation module, and a first signal conversion module. The calculation module includes a second signal conversion module and a programming interface. The upper computer is configured to convert programming data into first bus signals. When the calculation module is in a normal programming state, the second signal conversion module converts the first bus signals into first clock signals and first data signals to program the calculation module. When the calculation module is in a non-normal programming state, the first signal conversion module converts the first bus signals into second clock signals and second data signals to program the calculation module. A programming method is also provided.

10 Claims, 2 Drawing Sheets

PROGRAMMING SYSTEM AND METHOD

FIELD

The subject matter herein generally relates to a programming system and method.

BACKGROUND

A programming system and method may be used to update a complex programmable logic device or a programmable logic device.

BRIEF DESCRIPTION OF THE DRAWINGS

Implementations of the present technology will now be described, by way of example only, with reference to the attached figures.

DETAILED DESCRIPTION

Figure 1:
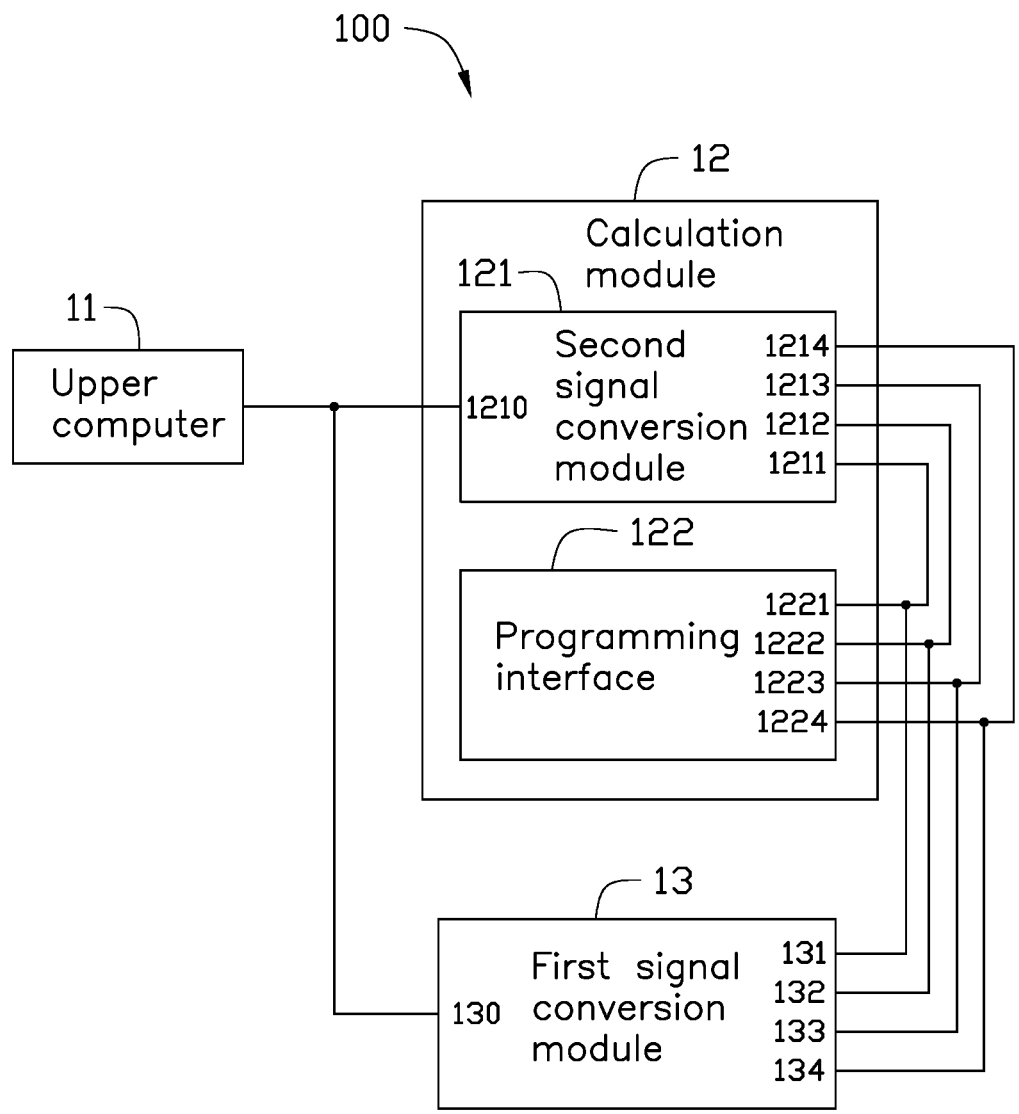
FIG. 1 is a block diagram of an embodiment of a programming system of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure will now be described in relation to a programming system and method.

FIG. 1 illustrates an embodiment of a programming system 100.

The programming system 100 can comprise an upper computer 11, a calculation module 12, and a first signal conversion module 13.

The upper computer 11 comprises an upper computer output terminal 111. The upper computer output terminal 111 is coupled to the calculation module 12 and the first signal conversion module 13. The upper computer 11 is configured to program the calculation module 12. The upper computer 11 is configured to convert programming data into first bus signals and output the first bus signals via the output terminal 111.

The calculation module 12 comprises a second signal conversion module 121 and a programming interface 122.

The second signal conversion module 121 comprises a second signal conversion module first input terminal 1210, a second signal conversion module second input terminal 1211, a second signal conversion module first output terminal 1212, a second signal conversion module second output terminal 1213, and a second signal conversion module third output terminal 1214. The second signal conversion module first input terminal 1210 is coupled to the upper computer output terminal 111 to receive the first bus signals.

The programming interface 122 comprises a programming interface output terminal 1221, a programming interface first input terminal 1222, a programming interface second input terminal 1223, and a programming interface third input terminal 1224. The programming interface output terminal 1221 is coupled to the second signal conversion module second input terminal 1211. The programming interface first input terminal 1222 is coupled to the second signal conversion module first output terminal 1212. The programming interface second input terminal 1223 is coupled to the second signal conversion module second output terminal 1213. The programming interface third input terminal 1224 is coupled to the second signal conversion module third output terminal 1214.

The first signal conversion module 13 comprises a first signal conversion module input terminal 130, a first signal conversion module first output terminal 131, a first signal conversion module second output terminal 132, a first signal conversion module third output terminal 133, and a first signal conversion module fourth output terminal 134. The first signal conversion module input terminal 130 is coupled to the upper computer output terminal 111 to receive the first bus signals. The first signal conversion module first output terminal 131 is coupled to the programming interface output terminal 1221. The first signal conversion module second output terminal 132 is coupled to the programming interface first input terminal 1222. The first signal conversion module third output terminal 133 is coupled to the programming interface second input terminal 1223. The first signal conversion module fourth output terminal 134 is coupled to the programming interface third input terminal 1224.

The first signal conversion module first output terminal 131 outputs a data test signal to the programming interface output terminal 1221 to simulate data signal output.

In one embodiment, the programming interface 122 is configured to receive programming signals. The programming signals can comprise clock signals, data signals, and mode selection signals.

Upon programming, the upper computer 11 outputs the first bus signals via the output terminal 111 and the calculation module 12 receives the first bus signals via the second signal conversion module 121 first input terminal 1210. When the calculation module 12 receives the first bus signals, the calculation module 12 outputs first data signals to the programming interface first input terminal 1222 via the second signal conversion module first output terminal 1212. The calculation module 12 outputs first mode selection signals to the programming interface second input terminal 1223 via the second signal conversion module second output terminal 1213. The calculation module 12 outputs first clock signals to the programming interface third input terminal 1224 via the second signal conversion module third output terminal 1214. The programming interface output terminal 1221 outputs a test signal to the second signal conversion module second input terminal 1211 to test the second signal conversion module 121.

In one embodiment, the calculation module 12 can be a programmable logic device, and the programming interface 122 can be a joint test action group (JTAG) interface. The calculation module 12 can comprise a test access port (TAP) to receive JTAG interface signal.

In one embodiment, the first signal conversion module 13 can be a signal expander. The first signal conversion module 13 is configured to convert the first bus signals into general purpose input/output (GPIO) bus signals. The first bus signals can be serial bus signals, or can be inter-integrated circuit (I2C) bus signals.

When the calculation module 12 is in a normal operation state, the calculation module 12 receives the I2C bus signals outputted by the upper computer 11. The second signal conversion module 121 converts the I2C bus signals into the first clock signals, the first mode selection signals, and the first data signals. The first clock signals, the first mode selection signals, and the first data signals are output to the programming interface 122. The programming interface 122 output terminal 1221 outputs a first test signal to test a goal node reading/writing function of the calculation module 12.

When the programming in the calculation module 12 is failure, the calculation module 12 may disable the second signal conversion module 121, or the second signal conversion module 121 may be in a non-normal operation state. The second signal conversion module 121 does not convert the I2C bus signals. The first signal conversion module 13 receives the I2C bus signals and converts the I2C bus signals into second clock signals, second data signals, and second mode selection signals. The first signal conversion module 13 outputs the second clock signals, the second data signals, and the second mode selection signals to the programming interface 122. The first signal conversion module first output terminal 131 outputs a second test signal to the programming interface output terminal 1221 for handshake communication. The first signal conversion module second output terminal 132 outputs the second data signals to the programming interface first input terminal 1222. The first signal conversion module third output terminal 133 outputs the mode selection signals to the programming interface second input terminal 1223. The first signal conversion module fourth output terminal 134 outputs the second clock signals to the programming interface third input terminal 1224. The programming interface 122 can test the goal node reading/writing function of the calculation module 12 via the second clock signals, the second data signals, and the second mode selection signals.

The calculation module 12 writes or reads a programming signal during a clock signal period of the I2C bus signals. The clock signal period of the I2C bus signals comprises a falling edge changing to a rising edge. Thereby, the calculation module 12 writes or reads the programming signal without temporary storage.

Figure 2:
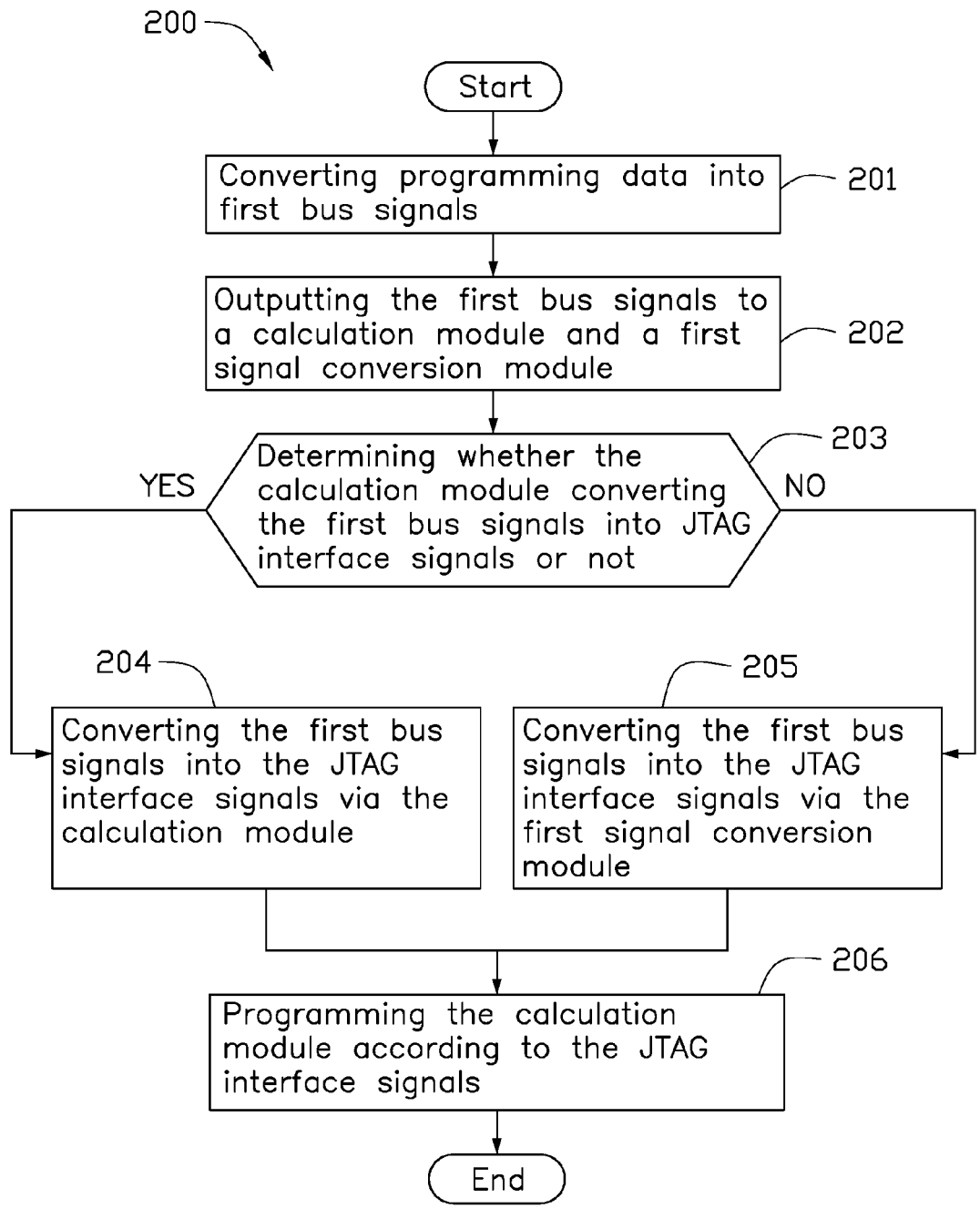
FIG. 2 is a flowchart of an embodiment of a programming method of the present disclosure.

Referring to FIG. 2, a flowchart is presented in accordance with an example embodiment of programming method. The example method is provided by way of example, as there are a variety of ways to carry out the method. The method described below can be carried out using the configurations illustrated in FIG. 1, for example, and various elements of these figures are referenced in explaining the example method. Each block shown in FIG. 2 represents one or more processes, methods, or subroutines, carried out in the example method. Furthermore, the illustrated order of blocks is illustrative only and the order of the blocks can change. Additional blocks can be added or fewer blocks may be utilized without departing from this disclosure. The example method can begin at block 1.

In step 201, the upper computer 11 converts the programming data into the first bus signals.

In step 202, the upper computer 11 outputs the first bus signals to the calculation module 12 and the first signal conversion module 13.

In step 203, the calculation module 12 determines whether or not the calculation module 12 converts the first bus signals into the JTAG interface signals.

In step 204, the calculation module 12 converts the first bus signals into the JTAG interface signals.

In step 205, the first signal conversion module 13 converts the first bus signals into the JTAG interface signals.

In step 206, the calculation module 12 is programmed according to the JTAG interface signals.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A programming system, comprising:
   an upper computer, configured to convert programming data into first bus signals;
   a first signal conversion module, coupled to the upper computer and configured to receive the first bus signals; and
   a calculation module, comprising:
      a second signal conversion module, coupled to the upper computer and configured to receive the first bus signals; and
      a programming interface, coupled to the first signal conversion module and the second
   signal conversion module;
   wherein when the calculation module is in a normal programming state, the second signal conversion module converts the first bus signals into first clock signals and first data signals and outputs the first clock signals and the first data signals to the programming interface to program the calculation module; and
   when the calculation module is in a non-normal programming state, the first signal conversion module converts the first bus signals into second clock signals and second data signals and outputs the second clock signals and the second data signals to the programming interface to program the calculation module.

2. The programming system of claim 1, wherein when the calculation module is in the non-normal programming state, the second signal conversion module does not convert the first bus signals.

3. The programming system of claim 1, wherein when the calculation module is in the normal programming state, the second signal conversion module converts the first bus signals into the first clock signals, the first data signals, and first mode selection signals; the second signal conversion module outputs the first clock signals, the first data signals, and the first mode selection signals to the programming interface to program the calculation module; and
   when the calculation module is in the non-normal programming state, the first signal conversion module converts the first bus signals into the second clock signals, the second data signals, and second mode selection signals; and the first signal conversion module outputs the second clock signals, the second data signals, and the second mode selection signals to the programming interface to program the calculation module.

4. The programming system of claim 1, wherein the upper computer comprises a upper computer output terminal; the second signal conversion module comprises a second signal conversion module first input terminal, a second signal conversion module second input terminal, a second signal conversion module first output terminal, a second signal conversion module second output terminal, and a second signal conversion module third output terminal; and the second signal conversion module first input terminal is coupled to the upper computer output terminal to receive the first bus signals.

5. The programming system of claim 4, wherein the programming interface comprises a programming interface output terminal, a programming interface first input terminal, a programming interface second input terminal, and a programming interface third input terminal; and the programming interface output terminal is coupled to the second signal conversion module second input terminal, the programming interface first input terminal is coupled to the second signal conversion module first output terminal, the programming interface second input terminal is coupled to the second signal conversion module second output terminal, and the programming interface third input terminal is coupled to the second signal conversion module third output terminal.

6. The programming system of claim 5, wherein the first signal conversion module comprises a first signal conversion module input terminal, a first signal conversion module first output terminal, a first signal conversion module second output terminal, a first signal conversion module third output terminal, and a first signal conversion module fourth output terminal; and the first signal conversion module input terminal is coupled to the upper computer output terminal to receive the first bus signals, the first signal conversion module first output terminal is coupled to the programming interface output terminal, the first signal conversion module second output terminal is coupled to the programming interface first input terminal, the first signal conversion module third output terminal is coupled to the programming interface second input terminal, and the first signal conversion module fourth output terminal is coupled to the programming interface third input terminal.

7. The programming system of claim 1, wherein the calculation module writes or reads a programming signal during a clock signal period of the first bus signals, the clock signal period comprises a falling edge changing to a rising edge.

8. The programming system of claim 1, wherein the first bus signals is serial bus signals.

9. The programming system of claim 1, wherein the first bus signals is inter integrated circuit (I2C) bus signals.

10. The programming system of claim 1, wherein the calculation module is a programmable logic device.

\* \* \* \* \*